«12» United States Patent
Stauffer et al.

(10) Patent No.: US 9,852,806 B2
(45) Date of Patent: Dec. 26, 2017

(54) SYSTEM FOR GENERATING A TEST PATTERN TO DETECT AND ISOLATE STUCK FAULTS FOR AN INTERFACE USING TRANSITION CODING

(71) Applicant: Kandou Labs SA, Lausanne (CH)

(72) Inventors: David R. Stauffer, Essex Junction, VT (US); Andrew Kevin John Stewart, Astcote (GB); John D. Keay, Bedford (GB)

(73) Assignee: KANDOU LABS, S.A. (CH)

( * ) Notice: Subject to any disclaimer, the term of this patent is extended or adjusted under 35 U.S.C. 154(b) by 0 days.

(21) Appl. No.: 14/746,477

(22) Filed: Jun. 22, 2015

(65) Prior Publication Data

US 2015/0370676 A1 Dec. 24, 2015

Related U.S. Application Data

(60) Provisional application No. 62/015,172, filed on Jun. 20, 2014.

(51) Int. Cl.
*H03M 13/00* (2006.01)
*G11C 29/02* (2006.01)
(Continued)

(52) U.S. Cl.
CPC .............. *G11C 29/025* (2013.01); *G11C 5/04* (2013.01); *G11C 29/18* (2013.01); *G11C 29/702* (2013.01); *G11C 2029/1802* (2013.01)

(58) Field of Classification Search
CPC ....... G11C 5/04; G11C 29/025; G11C 29/702; G11C 29/18; G11C 2029/1802;
(Continued)

(56) References Cited

U.S. PATENT DOCUMENTS 668,687 A 2/1901 Mayer
780,883 A 1/1905 Hinchman
(Continued)

FOREIGN PATENT DOCUMENTS

CN 101478286 7/2009
EP 2039221 B1 3/2009
WO 2011119359 9/2011

OTHER PUBLICATIONS

International Search Report and Written Opinion of the International Searching Authority, dated Nov. 5, 2012, in International Patent Application S.N. PCT/EP2012/052767, 7 pages.
(Continued)

*Primary Examiner* — Guerrier Merant
(74) *Attorney, Agent, or Firm* — Invention Mine LLC

(57) ABSTRACT

Conventional methods using signal test patterns to identify wiring errors are difficult to apply to interfaces encoding information as signal state transitions rather than directly as signal states. A system utilizing excitation of wires with selected transition coded patterns and evaluation of received results is described to identify failed wire connections. This approach may be advantageously used to provide fault detection and redundant path selection in systems incorporating stacked chip interconnections using Through Silicon Vias.

20 Claims, 11 Drawing Sheets

(51) Int. Cl.
*G11C 5/04* (2006.01)
*G11C 29/18* (2006.01)
*G11C 29/00* (2006.01)

(58) Field of Classification Search
CPC ..... H04L 1/243; H04L 1/244; H04L 12/2697;
H04L 43/50; H04L 43/0847; H04L 43/18;
H04L 43/06; H04L 49/9057; H04L 47/34;
H04L 12/42; H04L 1/245; G06F 11/221;
G01R 31/31716
See application file for complete search history.

(56) References Cited

U.S. PATENT DOCUMENTS

| | | | |
|---|---|---|---|
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara et al. |
| 4,181,967 A | 1/1980 | Nash et al. |
| 4,206,316 A | 6/1980 | Burnsweig et al. |
| 4,276,543 A | 6/1981 | Miller |
| 4,486,739 A | 12/1984 | Franaszek et al. |
| 4,499,550 A | 2/1985 | Ray et al. |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 5,017,924 A | 5/1991 | Guiberteau |
| 5,053,974 A | 10/1991 | Penz |
| 5,166,956 A | 11/1992 | Baltus et al. |
| 5,168,509 A | 12/1992 | Nakamura et al. |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan et al. |
| 5,449,895 A | 9/1995 | Hecht |
| 5,459,465 A | 10/1995 | Kagey |
| 5,461,379 A | 10/1995 | Weinman |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss et al. |
| 5,626,651 A | 5/1997 | Dullien |
| 5,629,651 A | 5/1997 | Mizuno |
| 5,659,353 A | 8/1997 | Kostreski et al. |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey et al. |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 6,005,895 A | 12/1999 | Perino et al. |
| 6,084,883 A | 7/2000 | Norrell et al. |
| 6,172,634 B1 | 1/2001 | Leonowich et al. |
| 6,175,230 B1 | 1/2001 | Hamblin et al. |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino et al. |
| 6,378,073 B1 | 4/2002 | Davis |
| 6,398,359 B1 | 6/2002 | Silverbrook |
| 6,404,820 B1 | 6/2002 | Postol |
| 6,417,737 B1 | 7/2002 | Moloudi et al. |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino et al. |
| 6,509,773 B2 | 1/2003 | Buchwald et al. |
| 6,522,699 B1 | 2/2003 | Anderson |
| 6,556,628 B1 | 4/2003 | Poulton et al. |
| 6,563,382 B1 | 5/2003 | Yang et al. |
| 6,621,427 B2 | 9/2003 | Greenstreet |
| 6,624,699 B2 | 9/2003 | Yin |
| 6,650,638 B1 | 11/2003 | Walker et al. |
| 6,661,355 B2 | 12/2003 | Cornelius et al. |
| 6,664,355 B2 | 12/2003 | Kim |
| 6,766,342 B2 | 7/2004 | Kechriotis |
| 6,839,429 B1 | 1/2005 | Gaikwad et al. |
| 6,865,234 B1 | 3/2005 | Agazzi |
| 6,865,236 B1 | 3/2005 | Terry |
| 6,876,317 B2 | 4/2005 | Sankaran |
| 6,954,492 B1 | 10/2005 | Williams |
| 6,972,701 B2 | 12/2005 | Jansson |
| 6,990,138 B2 | 1/2006 | Bejjani |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,080,288 B2 | 7/2006 | Ferraiolo |
| 7,082,557 B2 | 7/2006 | Schauer |
| 7,085,153 B2 | 8/2006 | Ferrant et al. |
| 7,127,003 B2 | 10/2006 | Rajan |
| 7,142,612 B2 | 11/2006 | Horowitz et al. |
| 7,142,865 B2 | 11/2006 | Tsai |
| 7,167,019 B2 | 1/2007 | Broyde et al. |
| 7,180,949 B2 | 2/2007 | Kleveland et al. |
| 7,184,483 B2 | 2/2007 | Rajan |
| 7,199,728 B2 | 4/2007 | Dally |
| 7,231,558 B2 | 6/2007 | Gentieu |
| 7,269,130 B2 | 9/2007 | Pitio |
| 7,335,976 B2 | 2/2008 | Chen |
| 7,336,112 B1 | 2/2008 | Sha |
| 7,346,819 B2 | 3/2008 | Bansal |
| 7,356,213 B1 | 4/2008 | Cunningham et al. |
| 7,358,869 B1 | 4/2008 | Chiarulli et al. |
| 7,362,130 B2 | 4/2008 | Broyde et al. |
| 7,362,697 B2 | 4/2008 | Becker |
| 7,366,942 B2 | 4/2008 | Lee |
| 7,372,390 B2 | 5/2008 | Yamada |
| 7,389,333 B2 | 6/2008 | Moore et al. |
| 7,397,302 B2 | 7/2008 | Bardsley |
| 7,400,276 B1 | 7/2008 | Sotiriadis |
| 7,428,273 B2 | 9/2008 | Foster |
| 7,539,532 B2 | 5/2009 | Tran |
| 7,570,704 B2 | 8/2009 | Nagarajan |
| 7,620,116 B2 | 11/2009 | Bessios |
| 7,633,850 B2 | 12/2009 | Ahn |
| 7,643,588 B2 | 1/2010 | Visalli |
| 7,650,525 B1 | 1/2010 | Chang |
| 7,656,321 B2 | 2/2010 | Wang |
| 7,697,915 B2 | 4/2010 | Behzad |
| 7,698,088 B2 | 4/2010 | Sul |
| 7,706,524 B2 | 4/2010 | Zerbe |
| 7,746,764 B2 | 6/2010 | Rawlins et al. |
| 7,787,572 B2 | 8/2010 | Scharf et al. |
| 7,808,456 B2 | 10/2010 | Chen |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen et al. |
| 7,933,770 B2 | 4/2011 | Kruger et al. |
| 8,000,664 B2 | 8/2011 | Khorram |
| 8,030,999 B2 | 10/2011 | Chatterjee |
| 8,064,535 B2 | 11/2011 | Wiley |
| 8,091,006 B2 | 1/2012 | Prasad et al. |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,199,849 B2 | 6/2012 | Oh |
| 8,233,544 B2 | 7/2012 | Bao |
| 8,253,454 B2 | 8/2012 | Lin |
| 8,279,094 B2 | 10/2012 | Abbasfar |
| 8,289,914 B2 | 10/2012 | Li |

(56) References Cited

U.S. PATENT DOCUMENTS

| | | |
|---|---|---|
| 8,295,250 B2 | 10/2012 | Gorokhov |
| 8,295,336 B2 | 10/2012 | Lutz |
| 8,310,389 B1 | 11/2012 | Chui |
| 8,341,492 B2 | 12/2012 | Shen |
| 8,359,445 B2 | 1/2013 | Ware |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,462,891 B2 | 6/2013 | Kizer et al. |
| 8,498,368 B1 | 7/2013 | Husted |
| 8,520,493 B2 | 8/2013 | Goulahsen |
| 8,547,272 B2 | 10/2013 | Nestler et al. |
| 8,578,246 B2 | 11/2013 | Mittelholzer |
| 8,588,280 B2 | 11/2013 | Oh et al. |
| 8,593,305 B1 | 11/2013 | Tajalli et al. |
| 8,602,643 B2 | 12/2013 | Gardiner |
| 8,604,879 B2 | 12/2013 | Mourant |
| 8,620,166 B2 | 12/2013 | Dong |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,674,861 B2 | 3/2014 | Matsuno |
| 8,687,968 B2 | 4/2014 | Nosaka |
| 8,718,184 B1 | 5/2014 | Cronie |
| 8,755,426 B1 | 6/2014 | Cronie |
| 8,780,687 B2 | 7/2014 | Clausen |
| 8,782,578 B2 | 7/2014 | Tell |
| 8,831,440 B2 | 9/2014 | Yu |
| 8,879,660 B1 | 11/2014 | Peng |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,989,317 B1 | 3/2015 | Holden |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,148,087 B1 | 9/2015 | Tajalli |
| 9,152,495 B2 | 10/2015 | Losh |
| 9,178,503 B2 | 11/2015 | Hsieh |
| 9,183,085 B1 | 11/2015 | Northcott |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1* | 8/2016 | Smith ............... H04L 49/9057 |
| 9,444,654 B2 | 9/2016 | Hormati |
| 9,455,744 B2 | 9/2016 | George |
| 9,455,765 B2 | 9/2016 | Schumacher |
| 9,509,437 B2 | 11/2016 | Shokrollahi |
| 9,544,015 B2 | 1/2017 | Ulrich |
| 2001/0055344 A1 | 12/2001 | Lee et al. |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0174373 A1 | 11/2002 | Chang |
| 2003/0016770 A1 | 1/2003 | Trans |
| 2003/0071745 A1 | 4/2003 | Greenstreet |
| 2003/0086366 A1 | 5/2003 | Branlund |
| 2003/0105908 A1 | 6/2003 | Perino et al. |
| 2003/0146783 A1 | 8/2003 | Brandy et al. |
| 2003/0227841 A1 | 12/2003 | Tateishi et al. |
| 2004/0003336 A1 | 1/2004 | Cypher |
| 2004/0003337 A1 | 1/2004 | Cypher |
| 2004/0027185 A1 | 2/2004 | Fiedler |
| 2004/0057525 A1 | 3/2004 | Rajan et al. |
| 2004/0086059 A1 | 5/2004 | Eroz et al. |
| 2004/0136319 A1* | 7/2004 | Becker ............... H01L 22/22 370/225 |
| 2004/0146117 A1 | 7/2004 | Subramaniam |
| 2004/0156432 A1 | 8/2004 | Hidaka |
| 2004/0161019 A1 | 8/2004 | Raghavan |
| 2004/0169529 A1 | 9/2004 | Afghahi |
| 2004/0216026 A1* | 10/2004 | Ferraiolo ............ G06F 11/221 714/758 |
| 2004/0250187 A1* | 12/2004 | Schauer ............. H04L 12/42 714/728 |
| 2005/0057379 A1 | 3/2005 | Jansson |
| 2005/0063493 A1 | 3/2005 | Foster |
| 2005/0134380 A1 | 6/2005 | Nairn |
| 2005/0135182 A1 | 6/2005 | Perino et al. |
| 2005/0149833 A1 | 7/2005 | Worley |
| 2005/0152385 A1 | 7/2005 | Cioffi |
| 2005/0174841 A1 | 8/2005 | Ho |
| 2005/0286643 A1 | 12/2005 | Ozawa et al. |
| 2006/0097786 A1 | 5/2006 | Su |
| 2006/0103463 A1 | 5/2006 | Lee |
| 2006/0107154 A1* | 5/2006 | Bansal ............ G01R 31/31716 714/738 |
| 2006/0115027 A1 | 6/2006 | Srebranig |
| 2006/0120486 A1 | 6/2006 | Visalli |
| 2006/0126751 A1 | 6/2006 | Bessios |
| 2006/0159005 A1 | 7/2006 | Rawlins et al. |
| 2006/0200708 A1* | 9/2006 | Gentieu ............... H04L 1/243 714/704 |
| 2007/0121716 A1 | 5/2007 | Nagarajan |
| 2007/0188367 A1 | 8/2007 | Yamada |
| 2007/0204205 A1 | 8/2007 | Niu |
| 2007/0260965 A1 | 11/2007 | Schmidt et al. |
| 2007/0263711 A1 | 11/2007 | Kramer et al. |
| 2007/0265533 A1 | 11/2007 | Tran |
| 2007/0283210 A1 | 12/2007 | Prasad et al. |
| 2008/0007367 A1 | 1/2008 | Kim |
| 2008/0104374 A1 | 5/2008 | Mohamed |
| 2008/0114562 A1* | 5/2008 | Sul ..................... H04L 1/245 702/122 |
| 2008/0159448 A1 | 7/2008 | Anim-Appiah |
| 2008/0169846 A1 | 7/2008 | Lan et al. |
| 2008/0192621 A1 | 8/2008 | Suehiro |
| 2008/0273623 A1 | 11/2008 | Chung et al. |
| 2008/0284524 A1 | 11/2008 | Kushiyama |
| 2008/0317188 A1 | 12/2008 | Staszewski |
| 2009/0059782 A1 | 3/2009 | Cole |
| 2009/0092196 A1 | 4/2009 | Okunev |
| 2009/0132758 A1 | 5/2009 | Jiang |
| 2009/0154500 A1 | 6/2009 | Diab et al. |
| 2009/0163612 A1 | 6/2009 | Lee et al. |
| 2009/0185636 A1 | 7/2009 | Palotai et al. |
| 2009/0193159 A1 | 7/2009 | Li |
| 2009/0195281 A1 | 8/2009 | Tamura |
| 2009/0212861 A1 | 8/2009 | Lim et al. |
| 2009/0228767 A1 | 9/2009 | Oh et al. |
| 2009/0257542 A1 | 10/2009 | Evans et al. |
| 2009/0316730 A1 | 12/2009 | Feng |
| 2009/0323864 A1 | 12/2009 | Tired |
| 2010/0023838 A1 | 1/2010 | Shen |
| 2010/0180143 A1 | 7/2010 | Ware et al. |
| 2010/0205506 A1 | 8/2010 | Hara |
| 2010/0215087 A1 | 8/2010 | Tsai |
| 2010/0215112 A1 | 8/2010 | Tsai |
| 2010/0235673 A1 | 9/2010 | Abbasfar |
| 2010/0296550 A1 | 11/2010 | Abou Rjeily |
| 2010/0296556 A1 | 11/2010 | Rave |
| 2010/0309964 A1 | 12/2010 | Oh |
| 2011/0051854 A1 | 3/2011 | Kizer et al. |

(56) References Cited

U.S. PATENT DOCUMENTS

| | | | |
|---|---|---|---|
| 2011/0072330 | A1 | 3/2011 | Kolze |
| 2011/0084737 | A1 | 4/2011 | Oh et al. |
| 2011/0127990 | A1 | 6/2011 | Wilson et al. |
| 2011/0235501 | A1 | 9/2011 | Goulahsen |
| 2011/0299555 | A1 | 12/2011 | Cronie et al. |
| 2011/0302478 | A1 | 12/2011 | Cronie et al. |
| 2011/0317559 | A1 | 12/2011 | Kern et al. |
| 2012/0063291 | A1 | 3/2012 | Hsueh |
| 2012/0152901 | A1 | 6/2012 | Nagorny |
| 2012/0161945 | A1 | 6/2012 | Single |
| 2012/0213299 | A1 | 8/2012 | Cronie et al. |
| 2013/0010892 | A1 | 1/2013 | Cronie |
| 2013/0051162 | A1 | 2/2013 | Amirkhany et al. |
| 2013/0147553 | A1 | 6/2013 | Iwamoto |
| 2013/0159761 | A1* | 6/2013 | Baumgartner ............ H04L 1/22 714/4.5 |
| 2013/0188656 | A1 | 7/2013 | Ferraiolo |
| 2013/0195155 | A1 | 8/2013 | Pan |
| 2013/0315501 | A1 | 11/2013 | Atanassov |
| 2014/0177645 | A1 | 6/2014 | Cronie |
| 2014/0226455 | A1 | 8/2014 | Schumacher |
| 2014/0254730 | A1 | 9/2014 | Kim et al. |
| 2015/0010044 | A1 | 1/2015 | Zhang |
| 2015/0078479 | A1 | 3/2015 | Whitby-Stevens |
| 2015/0146771 | A1 | 5/2015 | Walter |
| 2015/0333940 | A1 | 11/2015 | Shokrollahi |
| 2015/0380087 | A1 | 12/2015 | Mittelholzer |
| 2015/0381232 | A1 | 12/2015 | Ulrich |
| 2016/0020796 | A1 | 1/2016 | Hormati |
| 2016/0020824 | A1 | 1/2016 | Ulrich |
| 2016/0036616 | A1 | 2/2016 | Holden |

OTHER PUBLICATIONS

International Search Report and Written Opinion of the International Searching Authority, dated Jul. 14, 2011 in International Patent Application S.N. PCT/EP2011/002170, 10 pages.
Healey, A., et al., "A Comparison of 25 Gbps NRZ & PAM-4 Modulation used in Legacy & Premium Backplane Channels", DesignCon 2012, 16 pages.
International Search Report for PCT/US2014/053563, dated Nov. 11, 2014, 2 pages.
Clayton, P., "Introduction to Electromagnetic Compatibility", Wiley-Interscience, 2006.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Poulton, et al., "Multiwire Differential Signaling", UNC-CH Department of Computer Science Version 1.1, Aug. 6, 2003.
Skliar et al., A Method for the Analysis of Signals: the Square-Wave Method, Mar. 2008, Revista de Matematica: Teoria y Aplicationes, pp. 09-129.
Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.
International Search Report and Written Opinion for PCT/US14/052986 dated Nov. 24, 2014.
Burr, "Spherical Codes for M-ARY Code Shift Keying", University of York, Apr. 2, 1989, pp. 67-72, United Kingdom.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallani, L., et al., "Transmission Time Analysis for the Parallel Asynchronous Communication Scheme", IEEE Tranactions on Computers, vol. 52, No. 5, May 2003, pp. 558-571.
International Search Report and Written Opinion for PCT/EP2012/052767 dated May 11, 2012.
International Search Report and Written Opinion for PCT/EP2011/059279 dated Sep. 22, 2011.
International Search Report and Written Opinion for PCT/EP2011/074219 dated Jul. 4, 2012.
Notification of Transmittal of the International Search Report and the Written Opinion of the International Searching Authority, or the Declaration for PCT/EP2013/002681, dated Feb. 25, 2014, 15 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Abbasfar, A., "Generalized Differential Vector Signaling", IEEE International Conference on Communications, ICC '09, (Jun. 14, 2009), pp. 1-5.
Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Cheng, W., "Memory Bus Encoding for Low Power: A Tutorial", Quality Electronic Design, IEEE, International Symposium on Mar. 26-28, 2001, pp. 199-204, Piscataway, NJ.
Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.
Notification of Transmittal of International Search Report and the Written Opinion of the International Searching Authority, for PCT/US2015/018363, dated Jun. 18, 2015, 13 pages.
Counts, L., et al., "One-Chip Slide Rule Works with Logs, Antilogs for Real-Time Processing," Analog Devices Computational Products 6, Reprinted from Electronic Design, May 2, 1985, 7 pages.
Design Brief 208 Using the Anadigm Multiplier CAM, Copyright 2002 Anadigm, 6 pages.
Grahame, J., "Vintage Analog Computer Kits," posted on Aug. 25, 2006 in Classic Computing, 2 pages, http.//www.retrothing.com/2006/08/classic_analog_.html.
Schneider, J., et al., "ELEC301 Project: Building an Analog Computer," Dec. 19, 1999, 8 pages, http://www.clear.rice.edu/elec301/Projects99/anIgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
"Introduction to: Analog Computers and the DSPACE System," Course Material ECE 5230 Spring 2008, Utah State University, www.coursehero.com, 12 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, dated Mar. 3, 2015, for PCT/US2014/066893, 9 pages.
International Preliminary Report on Patentability for PCT/US2014/015840, dated Aug. 11, 2015, 7 pages.
Jiang, A., et al., "Rank Modulation for Flash Memories", IEEE Transactions of Information Theory, Jun. 2006, vol. 55, No. 6, pp. 2659-2673.
Zouhair Ben-Neticha et al, "The streTched"—Golay and other codes for high—SNR finite-delay quantization of the Gaussian source at 1/2 Bit per sample, IEEE Transactions on Communications, vol. 38, No. 12 Dec. 1, 1990, pp. 2089-2093, XP000203339, ISSN: 0090-6678, DOI: 10.1109/26.64647.

(56) References Cited

OTHER PUBLICATIONS

Oh, et al., Pseudo-Differential Vector Signaling for Noise Reduction in Single-Ended Signaling, DesignCon 2009.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching uthority, or the Declaration, for PCT/US2015/041161, dated Oct. 7, 2015, 8 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.

\* cited by examiner

Decoded Data
From Ingress Decoder

SYSTEM FOR GENERATING A TEST PATTERN TO DETECT AND ISOLATE STUCK FAULTS FOR AN INTERFACE USING TRANSITION CODING

This application claims priority to U.S. Provisional Application 62/015,172, filed Jun. 20, 2014, entitled "System for Generating a Test Pattern to Detect and Isolate Stuck Faults for an Interface using Transition Coding," which is herein incorporated by reference in its entirety for all purposes.

REFERENCES

The following materials are herein incorporated by reference in their entirety for all purposes:

US Publication 2015/0092532 of U.S. patent application Ser. No. 14/498,957, filed on Sep. 26, 2014 by Amin Shokrollahi and Roger Ulrich, entitled "Fault Tolerant Chip-to-Chip Communication with Advanced Voltage Regulator" (hereinafter Shokrollahi I).

BACKGROUND

This disclosure is relevant to interfaces which encode and decode data values as transitions on the interconnect medium and have redundant resources to bypass faulty connections. Examples of such codes are described in Shokrollahi I, including the FTTL4 code utilized as a descriptive example herein. Efficient hardware-based identification of faulty connections is desired to facilitate automated reconfiguration of the redundant resources. The disclosed invention is relevant generally to any interface using transition codes, but is of particular interest to interfaces of 3D chip stacks where the interconnect is composed of stacked Thru-Silicon Vias (TSVs).

FIG. 1 provides a model of the general case, where the transmission of data across an interface is characterized by the number of wires (n) and the number of allowed electrical states on each wire (s). The term "wire" is used within this disclosure to refer generally to one element of the interconnect medium, without limitation to e.g. metallic electrical connection for such medium.) For a state based code, data values of m bits width are encoded into corresponding codewords represented by a unique combination of states on the n wires. The state levels of the wires are detected at the receive end of the interface and decoded to reproduce the original data value.

Note that in the general case m and n are not necessarily equal. If the number of possible electrical states s of each wire is greater than 2 (i.e. multi-level signaling is employed), then it is possible to encode m data bits into n wires where n<m.

Another method of encoding data bits onto the wires of the interface is to define codewords based on whether or not a transition occurs on each wire rather than the actual state of the wire. The current state of the wire is irrelevant to a transition code; the receiver detects whether transitions occur on each wire and decodes the codeword accordingly.

If s>2, then it is possible to define more than one type of transition. The receiver can differentiate between types of transitions based on the origin and terminal states of the wire. This expands the available code space such that transition codes where n<m are possible.

Transition codes are one type of code that can be used on interfaces between chips of a three dimensional (3D) chip stack. The 3D chip stack for a typical application is shown in FIG. 2 where a controller chip on the bottom of the stack connects to multiple DRAM chips. In one such embodiment, write data is broadcast by the controller chip to DRAM chips (egress path), and DRAM chips respond on a tri-state bus to the controller chip (ingress path). The interconnections between chips are composed of Thru-Silicon Vias (TSVs) which provide a high density of I/O for a given chip area. However, TSV yield is a significant factor in the manufacturing process for 3D chip stacks, and interconnect redundancy is desirable to mitigate yield impacts.

FIG. 3 illustrates an embodiment of the data transmission path of FIG. 1 with data steering stages added to support an interconnect that has one redundant wire available. Since the codeword requires n wires, and n+1 wires are available, then a fault on any one wire can be bypassed. Other embodiments may include more than one redundant wire, and thus may support correction of additional faults.

It is desirable to transmit a test pattern over the interface in FIG. 3 and check the pattern at the receive end to determine if the n wires being used are free from faults. Such test patterns may be implemented as a Built-In-Self-Test (BIST) feature of the interface, or may be generated external to the chip and applied by manufacturing test equipment to test the interface as part of a manufacturing or assembly process. If a fault is detected, it is desirable for the Pattern Checker to isolate which wire contains the fault based on the received test pattern. The data steering can be reconfigured based on this detection to bypass the wire with the fault. Known techniques exist for detecting and isolating stuck faults on wires using binary state-based codes. However, these techniques do not work with transition codes where the mapping between data bits and wires is not one-for-one.

Furthermore, it is desirable to minimize the required test circuitry incorporated into the DRAM chips shown in the application in FIG. 2. Toward this end, the DRAM is simplified to loopback the egress path to the ingress path with minimal processing as shown for the Data Loopback 420 in the loopback path of FIG. 4. The Pattern Generator 410 and Pattern Checker 430 are both located on the controller chip. This architecture places the additional burden on the test pattern, in that faults on the egress path must be distinguishable from faults on the ingress path.

BRIEF DESCRIPTION

Given an arbitrary transition code meeting the disclosed requirements, an embodiment comprises:

A system for constructing a test pattern to be transmitted by the Pattern Generator 410 as shown in FIG. 4;

A system for a Pattern Checker 430 as shown in FIG. 4 to determine whether faults exist, and if faults exist then isolate which wire contains the fault, based on the codewords received in the test pattern;

A system for Data Loopback logic 420 in the test path as shown in FIG. 4 to loopback data from the egress path to the ingress path such that the Pattern Checker can differentiate between faults on the egress path and faults on the ingress path.

At least one embodiment disclosed herein is a Pattern Generator and Pattern Checker for a single interconnect segment as shown in FIG. 3. Another embodiment is a Pattern Generator, Data Loopback, and Pattern Checker used to test cascaded interconnect segments as shown in FIG. 4. A further embodiment allowing cascading of the interconnect segments can also be applied to a bidirectional data bus between the controller and DRAM chips of FIG. 2 by segmenting the bus during test modes such half of the data bus is used as an egress path, and half of the data bus is used as an ingress path.

Embodiments in accordance with the disclosure may be implemented by Built-In-Self-Test (BIST) circuits on the chip, or by external test equipment interfacing to the chip being tested.

At least one embodiment uses the FTTL4 transition code described in Shokrollahi I. No limitation is implied, however, as other embodiments may in general use any transition code that meets the requirements described.

DETAILED DESCRIPTION

Figure 1:
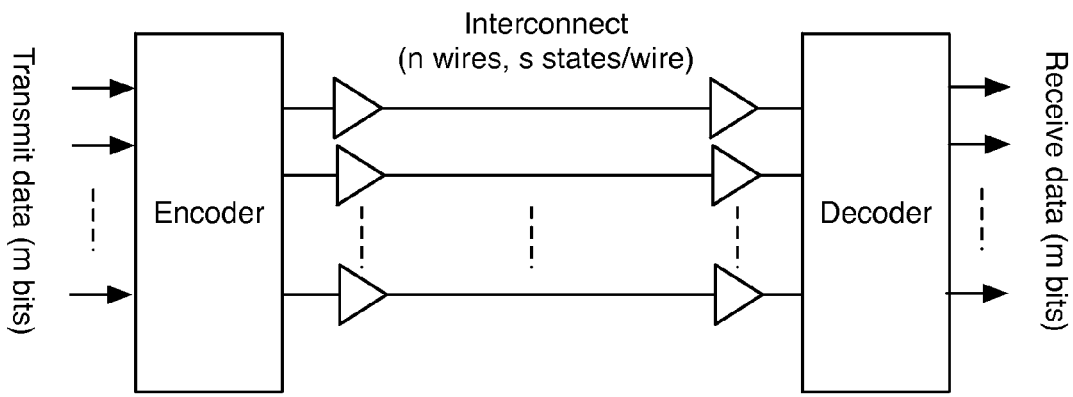
FIG. 1 illustrates an interface where data is encoded for transmission across an interconnection consisting of an arbitrary number of wires to a receiver where the codewords on the interface are decoded to reproduce the original data.

The disclosed embodiments describe a system of constructing a test pattern for an arbitrary transmission code that can quickly identify whether a wire on the interface failed, and identify which wire failed using a simple detection circuit so that the interface can use spare resources to bypass the failed wire. One embodiment of the disclosed systems and methods includes constructing a Pattern Generator, Pattern Checker, and Data Loopback function that can be used with the FTTL4 transition code in a 3D chip stack application. The dominant failure mechanism for such interfaces is stuck faults due to open connections at TSVs.

For descriptive purposes and without implying limitation, assumptions are made that:

1. The interface contains at most one fault. Test pattern errors will occur if multiple faults exist, but aliasing may occur such that the failing path cannot be properly identified. Known pattern generation techniques capable of distinguishing multiple errors without aliasing may be combined with the described systems and methods.

2. Failures can be adequately modeled using the stuck-fault model prevalently used in Design-For-Test strategies. This assumption is generally valid for the target application (TSVs of a 3D chip stack) since the dominant circuit fault is an open connection. Other known failure modeling methods may also be applied to address other failure modes.

This disclosure develops a mathematical description of an arbitrary transition code, and describes properties of the codewords of the arbitrary code. The disclosed system utilizes these properties to group codewords into sets of codewords transmitted by the Pattern Generator and sets of codewords detected by the Pattern Checker and utilized for fault isolation. The detection and processing that may be implemented by the Data Loopback function is also defined. One embodiment is described for the FTTL4 transition code as described in Shokrollahi I.

Transition Functions and Properties of Codewords

Assume a transition code with n wires and s states per wire, where the states of a wire represent signal levels on the transmission media. The data being transmitted on the interface is coded based on which wires make transitions, and the origin and terminal wire states of those transitions. Assume a transition function:

$$W_0 = T_i(W_{-1}) \qquad \text{[Eqn. 1]}$$

The function $(T_i)$ describes the new state of the wire $(W_0)$ based on the previous state of the wire $(W_{-1})$. This function is applied to specific wires when encoding specific data values. A transition code may define several possible transition functions that are applied to the n wires based on the data value being encoded. The number of wires and the number of uniquely identifiable transition functions determines the number of data bits that can be coded on n wires. The greater the number of wire states s, the greater the number of transition functions that can be defined and uniquely identified at the receiver.

Assume a transition code has defined f transition functions $\{T_0, T_1, \ldots T_{f-1}\}$. The definition of the $T_0$ function is reserved and is defined as the null function where the wire does not change state:

$$W_0 = T_0(W_{-1}) = W_{-1} \qquad \text{[Eqn. 2]}$$

All other transition functions involve a change of state for wire i.

The transition code maps data values to codewords that are constructed by defining a transition function for each of n wires: $(T_{i1}, T_{i2}, \ldots T_{in})$, where each $T_{ij} \in \{T_0, T_1, \ldots T_{f-1}\}$.

Note that some transition functions can be aliases of other transition functions. A transition function defines the new state of a wire $W_0$ based on the previous state of a wire $W_{-1}$. The transition function is defined by the transitions of wire states $(W_{-1}, W_0)$ for all s possible values of wire state $W_{-1}$. Given two transition functions, if there exists a transition $(W_{-1}, W_0)$ where the state values of $W_{-1}$ and $W_0$ are the same for both functions, then the transition functions are aliases of each other.

Now define a property called transition count (TC) of a given codeword of a transition code as the total number of the n wires for which $T_{ij} \in \{T_1, \ldots T_{f-1}\}$ and $T_{ij} \notin \{T_0\}$. The transition count represents the total number of wires that are making state transitions for a given codeword.

Sets of Codewords

Given the definition of the property TC, codewords of the transition code can be grouped into sets with similar values of TC. A transition code can contain codewords with any TC in the range $0 \leq TC \leq n$. Let:

GROUP(c)←set of valid transition codewords of the transition code for which TC=c, where $2 \leq c \leq n$.

GROUP(c−1)←set of valid transition codewords of the transition code for which TC=c−1.

Valid values of c are restricted to ensure that the codewords of GROUP(c−1) contain at least one transition. This is necessary to allow identification of the bad wire. For completeness, the following set is defined:

GROUP(TC>c|TC<c−1)←egress-fault identification codewords that are not members of GROUP (c) or GROUP (c−1).

Next define:

FAULT(c, w)←set of codewords that result from a stuck fault on a codeword from GROUP(c).

The FAULT(c, w) set is constructed for each wire associated with wire index w in the range $1 \leq w \leq n$ by taking each member of GROUP(c), and changing the transition function for wire associated with wire index w to $T_0$, and adding the resulting codeword to FAULT(c, w) using the following rules:

1. If the codeword is the same as the original codeword (transition function for wire associated with wire index w was already $T_0$), then do not include the resulting codeword in set FAULT(c, w).
2. If the codeword is not the same as the original codeword then add the codeword to FAULT(c, w).
3. If the codeword in step 2 contains transition functions that can be aliased by other transition functions, then add additional codewords to FAULT(c, w) for every possible permutation of a transition function being replaced by its alias function.

The following algorithm provides a formalized description of the construction of the FAULT(c, w) sets:

```
for each wire index w do /* construct sets FAULT(c, w) */
    FAULT(c, w) := { };
    for each codeword ∈ GROUP(c) for which TC = c do
        new_codeword ← codeword modified by changing Tiw := T0;
        if codeword ≠ new_codeword then
            add new_codeword to set FAULT(c, w);
            for each wire index v where v ≠ w do
                add aliases of new_codeword to set FAULT(c, w);
            end for;
        end if;
    end for;
end for;
```

All of the codewords in FAULT(c, w) have the property that TC=c−1. The number of elements in FAULT(c, w) can be larger than the number of elements in GROUP(c) if some transition functions can alias other transition functions.

The OVERLAP(c, w) set for each wire w is defined as:
OVERLAP(c, w)←FAULT(c, w)∩GROUP(c−1)

This set determines valid reduced-transition codewords that will be decoded at the receiver in the presence of stuck faults, and can be used to detect the fault and identify a wire index associated with the wire on which the stuck fault has occurred.

The GENERATE(c) set is defined as the valid transition codewords in GROUP(c) which, when a stuck fault occurs on wire associated with wire index w, result in a codeword that is contained in one of the sets OVERLAP(c, w). This set determines the codewords that may be transmitted in the constructed test pattern.

Finally, the function DATA(S) is introduced for notation purposes, and is defined as the decoded data values corresponding to codeword(s) of argument S. Likewise, the function CODE(S) is defined as the set of encoded codewords corresponding to the data value(s) of argument S.

Test Pattern Construction

In order to construct a test pattern for the Pattern Generator, it is necessary that the definition of the transition code meet the following requirements:

1. There is a value c in the range $2 \leq c \leq n$ for which GROUP(c)≠{ } and GROUP(c−1)≠{ }.
2. For each wire associated with wire index w in the range $1 \leq w \leq n$, OVERLAP(c, w)≠{ }. (OVERLAP sets are not empty.)
3. For each wire index $w_1$ in the range $1 \leq w_1 \leq n$, and wire index $w_2$ in the range $1 \leq w_2 \leq n$, $w_1 \neq w_2$: OVERLAP(c, $w_1$)≠OVERLAP(c, $w_2$). (OVERLAP sets are unique.)
4. If the test pattern must propagate through cascaded segments of the interface, then:
GROUP(TC>c|TC<c−1)≠{ }.

Given a transition code that meets the above requirements the Pattern Generator is constructed by sending random data values∈DATA(GENERATE(c)) to generate valid transition codewords∈GENERATE(c).

If there are no stuck faults on the interface, the Pattern Checker only receives valid transition codewords∈GROUP(c). If a stuck fault exists, then valid reduced-transition codewords∈OVERLAP(c, w) where w corresponds to a wire index associated with the wire with the fault are also received. Additionally, invalid codewords may be received. The Pattern Checker can therefore be constructed such that it detects data words where:
rx_dataword∈DATA(OVERLAP(c, 0)∪OVERLAP(c, 1)∪ . . . ∪OVERLAP(c, n))

The Pattern Checker determines which wire contains a fault based upon which of the above codewords (or data values) are detected. This is based upon the behavior that in the presence of a single stuck fault on the wire associated with wire index w, at least some of the codewords received match elements in set OVERLAP(c, w) and will be decoded successfully. Given a test pattern that exercises all possible transitions of wire states on all wires, the Pattern Checker will eventually detect all of the valid reduced-transition codewords in set OVERLAP(c, w). While some of these codewords may also exist in other OVERLAP sets, in general at least some elements of other sets will not have been encountered by the Pattern Checker.

A special case exists if the OVERLAP set for one wire is a subset of the OVERLAP set for another wire. Transition code requirements do not exclude this case. In this case, the Pattern Checker may encounter all valid reduced-transition codewords of the OVERLAP sets for both wires; indicating that the wire with the stuck fault is the wire represented by the OVERLAP set with the most elements. If the fault were on the wire corresponding to the smaller set, then some valid reduced-transition codewords in the larger set would not have been encountered.

Pattern Checker implements data processing that is specified by the following algorithm:

```
/* initialize */
wire_fault := none;
set_size := 0;
segment := ingress; /* if data propagates through a loopback, determine
segment that failed */
```

```
for each element i ∈ OVERLAP(c, w) for any w do
    cw_hit(w, i) := false;
end for;
/* run test */
for each rx_dataword received in the test pattern do
    codeword := CODE(rx_dataword);
    if codeword ∈ OVERLAP(c, w) for any w then cw_hit
    (w, codeword) := true;
    if codeword ∈ GROUP(TC > c | TC < c−1) then segment := egress;
    if codeword is an invalid codeword then ignore it;
end for;
/* post processing */
for each wire w do
    if all cw_hit(w, i) = 1 for set OVERLAP(c, w) then
        this_set_size := number of elements in set OVERLAP(c, w);
        if this_set_size > set_size then
            wire_fault := w; /* fault is on wire w */
            set_size := this_set_size;
        end if;
    end if;
end for; /* stuck fault is on wire w of segment */
```

The Pattern Checker described by the above algorithm also identifies whether the stuck fault was in an egress or an ingress segment as described in the next section.

Data Loopback

Figure 2:
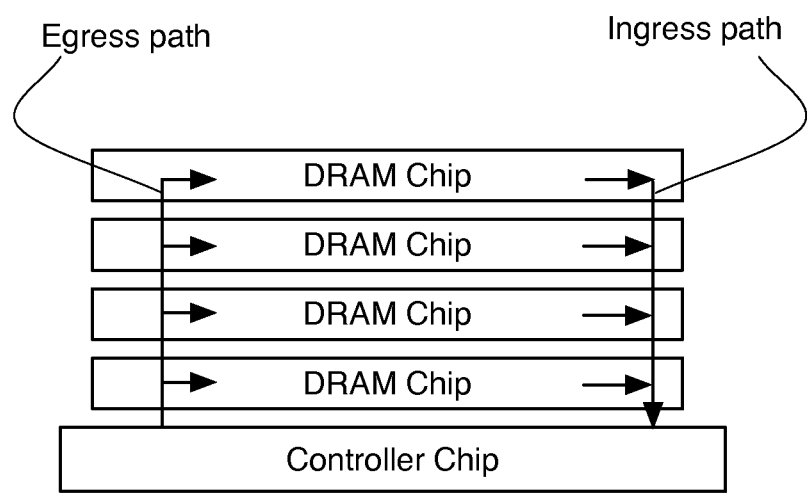
FIG. 2 illustrates a three dimensional (3D) stack consisting of a controller chip and DRAM chips, and illustrating an egress datapath from the controller to the DRAM chips, and an ingress datapath from the DRAM chips back to the controller chip.
Figure 3:
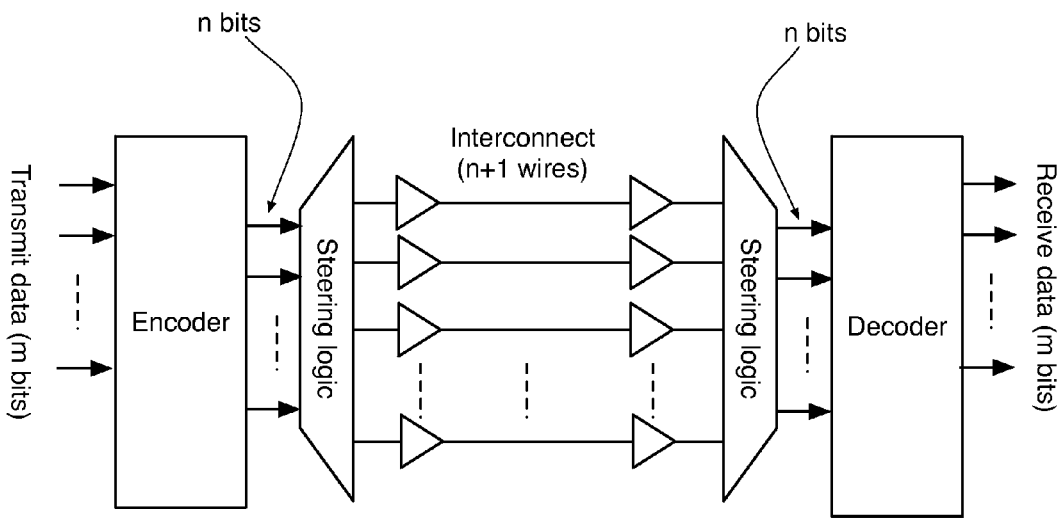
FIG. 3 illustrates the interface of FIG. 1 with the addition of a redundant wire and data steering stages to utilize the redundant wire to bypass a fault on any of the interconnect wires.
Figure 4:
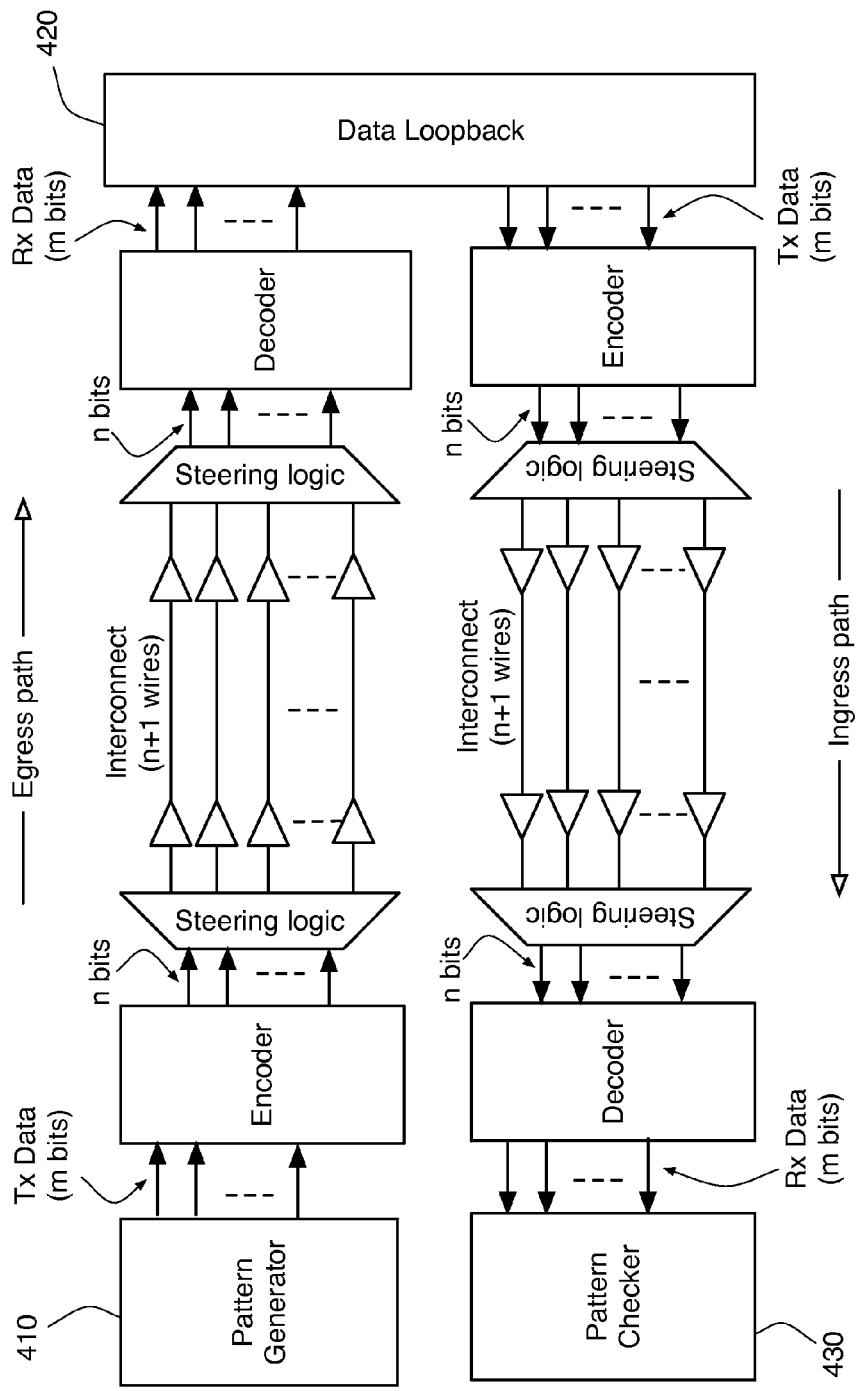
FIG. 4 illustrates an embodiment in which the interface of FIG. 3 has been cascaded for the egress and the ingress data path segments of FIG. 2, illustrating the placement of Pattern Generator 410 and Pattern Checker 430 on the controller chip, and the placement of Data Loopback 420 in the test path on the DRAM chip.

It is desirable in the 3D chip stack configuration shown in FIG. 2 to minimize test logic on the DRAM chip by looping test data from the egress data path onto the ingress datapath as shown in FIG. 4, and performing both pattern generation and pattern checking on the controller chip. The Data Loopback function in FIG. 4 must do some minimal checking of the test pattern received from the egress interface and some minimal modification of the test pattern sent on the ingress interface; the purpose of this is to provide a means for the Pattern Checker to distinguish between faults on the egress versus ingress paths.

The Data Loopback implements data processing that is specified by the following algorithm:

```
/* initialize */
for each element i ∈ OVERLAP(c, w)
    for any w do
        cw_toggle(w, i) := 0;
    end for;
/* run test */
for each rx_dataword received in test pattern do
    codeword := CODE(rx_dataword);
    if codeword ∈ OVERLAP(c, w) for any w
        then cw_toggle(w, i) := (cw_toggle(w, i) + 1) mod 2;
        if cw_toggle(w, i) ≠ 0 then
            /* alternate insertion of egress-fault indication codeword to
               indicate fault is on egress */
            tx_dataword := any i ∈ DATA(GROUP
            (TC > c | TC < c−1));
        else /* alternate propagation of valid reduced-transition
               codeword */
            tx_dataword := rx_dataword;
        end if;
    else if codeword is an invalid codeword then
        /* suppress propagation of invalid codewords */
        tx_dataword := any i ∈ DATA(GROUP(c));
    else
        tx_dataword := rx_dataword;
    end if;
end for;
```

As described above, the Data Loopback propagates valid transition codewords (including valid reduced-transition codewords from the OVERLAP(c, w) sets) through the loopback path. However, if codewords from the OVERLAP (c, w) sets are detected then the propagation of these codewords is alternated with the propagation of one or more egress-fault indication codewords from the GROUP (TC>c|TC<c−1) set. The presence or absence of codewords from GROUP(TC>c|TC<c−1) is used by the Pattern Checker at the controller to determine whether the stuck fault is on the controller to DRAM (egress) path or on the DRAM to controller (ingress) path. This detection is supported by the algorithm implemented by the Pattern Checker presented previously.

The Data Loopback also suppresses any invalid codewords that are received from the egress path and substitutes a valid codeword on the return path. This is to avoid any unpredictable behavior.

Embodiment Using FTTL4 Transition Code

Referring to Shokrollahi I, the FTTL4 code defines n=3 wires with s=3 states (0, 1, 2). The following transition functions are defined:

$T_{NULL}$ Function: $W_0 = T_{NULL}T_{NULL}(W_{-1}) = W_{-1}$ $T_{INC}$ Function: $W_0 = T_{INC}(W_{-1}) = (W_{-1}+1) \bmod 3$ $T_{DEC}$ Function: $W_0 = T_{DEC}(W_{-1}) = (W_{-1}-1) \bmod 3$ $T_{MID}$ Function: $W_0 = T_{MID}(W_{-1}) = (W_{-1}-1)$ if $W_{-1}=1,2$ $(W_{-1}+1)$ if $W_{-1}=0$ Table I is a truth table for the code:

TABLE I truth table for FTTL4 code

| Data | Code |
|---|---|
| 0000 | $T_{NULL}$, $T_{INC}$, $T_{INC}$ |
| 1000 | $T_{INC}$, $T_{INC}$, $T_{NULL}$ |
| 0001 | $T_{NULL}$, $T_{INC}$, $T_{DEC}$ |
| 1001 | $T_{INC}$, $T_{DEC}$, $T_{NULL}$ |
| 0010 | $T_{NULL}$, $T_{DEC}$, $T_{INC}$ |
| 1010 | $T_{DEC}$, $T_{INC}$, $T_{NULL}$ |
| 0011 | $T_{NULL}$, $T_{DEC}$, $T_{DEC}$ |
| 1011 | $T_{DEC}$, $T_{DEC}$, $T_{NULL}$ |
| 0100 | $T_{INC}$, $T_{NULL}$, $T_{INC}$ |
| 1100 | $T_{MID}$, $T_{NULL}$, $T_{NULL}$ |
| 0101 | $T_{INC}$, $T_{NULL}$, $T_{DEC}$ |
| 1101 | $T_{NULL}$, $T_{NULL}$, $T_{MID}$ |
| 0110 | $T_{DEC}$, $T_{NULL}$, $T_{INC}$ |
| 1110 | $T_{NULL}$, $T_{MID}$, $T_{NULL}$ |
| 0111 | $T_{DEC}$, $T_{NULL}$, $T_{DEC}$ |
| 1111 | $T_{NULL}$, $T_{NULL}$, $T_{NULL}$ |

This contains the following sets of valid transition codewords for c=2:

GROUP(TC=2)=
{($T_{NULL}$, $T_{INC}$, $T_{INC}$), ($T_{NULL}$, $T_{INC}$, $T_{DEC}$), ($T_{NULL}$, $T_{DEC}$, $T_{INC}$), ($T_{NULL}$, $T_{DEC}$, $T_{DEC}$), ($T_{INC}$, $T_{NULL}$, $T_{INC}$), ($T_{INC}$, $T_{NULL}$, $T_{DEC}$), ($T_{DEC}$, $T_{NULL}$, $T_{INC}$), ($T_{DEC}$, $T_{NULL}$, $T_{DEC}$), ($T_{INC}$, $T_{INC}$, $T_{NULL}$), ($T_{INC}$, $T_{DEC}$, $T_{NULL}$), ($T_{DEC}$, $T_{INC}$, $T_{NULL}$), ($T_{DEC}$, $T_{DEC}$, $T_{NULL}$)}

GROUP(TC=1)=
{($T_{MID}$, $T_{NULL}$, $T_{NULL}$), ($T_{NULL}$, $T_{NULL}$, $T_{MID}$), ($T_{NULL}$, $T_{MID}$, $T_{NULL}$)}

GROUP(TC>2|TC<1)={($T_{NULL}$, $T_{NULL}$, $T_{NULL}$)}

The $T_{INC}$ and $T_{DEC}$ can alias as $T_{MID}$ at the receiver. The fault sets including aliasing, assuming c=2 are:

FAULT(c=2, w=1)=
{($T_{NULL}$, $T_{NULL}$, $T_{INC}$), ($T_{NULL}$, $T_{NULL}$, $T_{DEC}$), ($T_{NULL}$, $T_{NULL}$, $T_{MID}$), ($T_{NULL}$, $T_{INC}$, $T_{NULL}$), ($T_{NULL}$, $T_{DEC}$, $T_{NULL}$), ($T_{NULL}$, $T_{MID}$, $T_{NULL}$)}

FAULT(c=2, w=2)=
{($T_{NULL}$, $T_{NULL}$, $T_{INC}$), ($T_{NULL}$, $T_{NULL}$, $T_{DEC}$), ($T_{NULL}$, $T_{NULL}$, $T_{MID}$), ($T_{INC}$, $T_{NULL}$, $T_{NULL}$), ($T_{DEC}$, $T_{NULL}$, $T_{NULL}$), ($T_{MID}$, $T_{NULL}$, $T_{NULL}$)}

FAULT(c=2, w=3)=
{($T_{NULL}$, $T_{INC}$, $T_{NULL}$), ($T_{NULL}$, $T_{DEC}$, $T_{NULL}$), ($T_{NULL}$, $T_{MID}$, $T_{NULL}$), ($T_{INC}$, $T_{NULL}$, $T_{NULL}$), ($T_{DEC}$, $T_{NULL}$, $T_{NULL}$), ($T_{MID}$, $T_{NULL}$, $T_{NULL}$)} and the intersection of the FAULT sets and SET(TC=1) are:
OVERLAP(c=2, w=1)={($T_{NULL}$, $T_{NULL}$, $T_{MID}$), ($T_{NULL}$, $T_{MID}$, $T_{NULL}$)}
OVERLAP(c=2, w=2)={($T_{NULL}$, $T_{NULL}$, $T_{MID}$), ($T_{MID}$, $T_{NULL}$, $T_{NULL}$)}
OVERLAP(c=2, w=3)={($T_{NULL}$, $T_{MID}$, $T_{NULL}$), ($T_{MID}$, $T_{NULL}$, $T_{NULL}$)}

The Data Loopback circuit on the DRAM will alternate the insertion of the codeword: GROUP(TC>2|TC<1)={($T_{NULL}$, $T_{NULL}$, $T_{NULL}$)}

This set corresponds to the set of data words:
DATA(GROUP(TC>2|TC<1))={b1111}

The Pattern Checker on the controller may interpret the codewords received for data values as wire faults as shown in Table II.

TABLE II

Error condition decode to wire faults

| Wire with fault | Codewords received for data values |
| --- | --- |
| Egress wire #1 | b1101, b1110, b1111 all occur |
| Egress wire #2 | b1100, b1101, b1111 all occur |
| Egress wire #3 | b1100, b1110, b1111 all occur |
| Ingress wire #1 | b1101 and b1110 both occur, b1111 does not occur |
| Ingress wire #2 | b1100 and b1101 both occur, b1111 does not occur |
| Ingress wire #3 | b1100 and b1110 both occur, b1111 does not occur |
| No faults | Never occur: b1100, b1101, b1110, b1111 |
| Multiple Faults | b1100, b1101, b1110 all occur |

The FAULT sets correspond to the following GENERATE set, which is equivalent to SET(TC=2) for this code:
GENERATE(2)=
{($T_{NULL}$, $T_{INC}$, $T_{INC}$), ($T_{NULL}$, $T_{INC}$, $T_{DEC}$), ($T_{NULL}$, $T_{DEC}$, $T_{INC}$), ($T_{NULL}$, $T_{DEC}$, $T_{DEC}$), ($T_{INC}$, $T_{NULL}$, $T_{INC}$), ($T_{INC}$, $T_{NULL}$, $T_{DEC}$), ($T_{DEC}$, $T_{NULL}$, $T_{INC}$), ($T_{DEC}$, $T_{NULL}$, $T_{DEC}$), ($T_{INC}$, $T_{INC}$, $T_{NULL}$), ($T_{INC}$, $T_{DEC}$, $T_{NULL}$), ($T_{DEC}$, $T_{INC}$, $T_{NULL}$), ($T_{DEC}$, $T_{DEC}$, $T_{NULL}$)}

The corresponding set of data values for the Pattern Generator are:
DATA(GENERATE(2))=
{b0000, b0001, b0010, b0011, b0100, b0101, b0110, b0111, b1000, b1001, b1010, b1011}

The Pattern Generator randomly generates data words from this set. The Data Loopback can substitute any of these data words on the ingress interface when an invalid codeword is detected on the egress interface.

Figure 5:
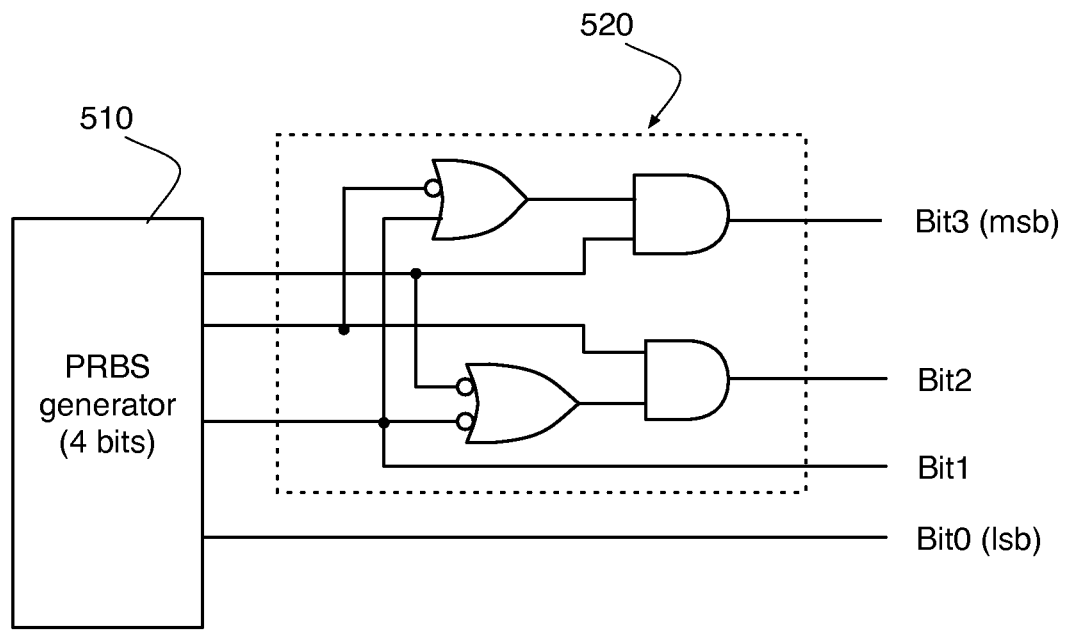
FIG. 5 illustrates an embodiment of Pattern Generator 410 in FIG. 4 for an FTTL4 code.
Figure 6:
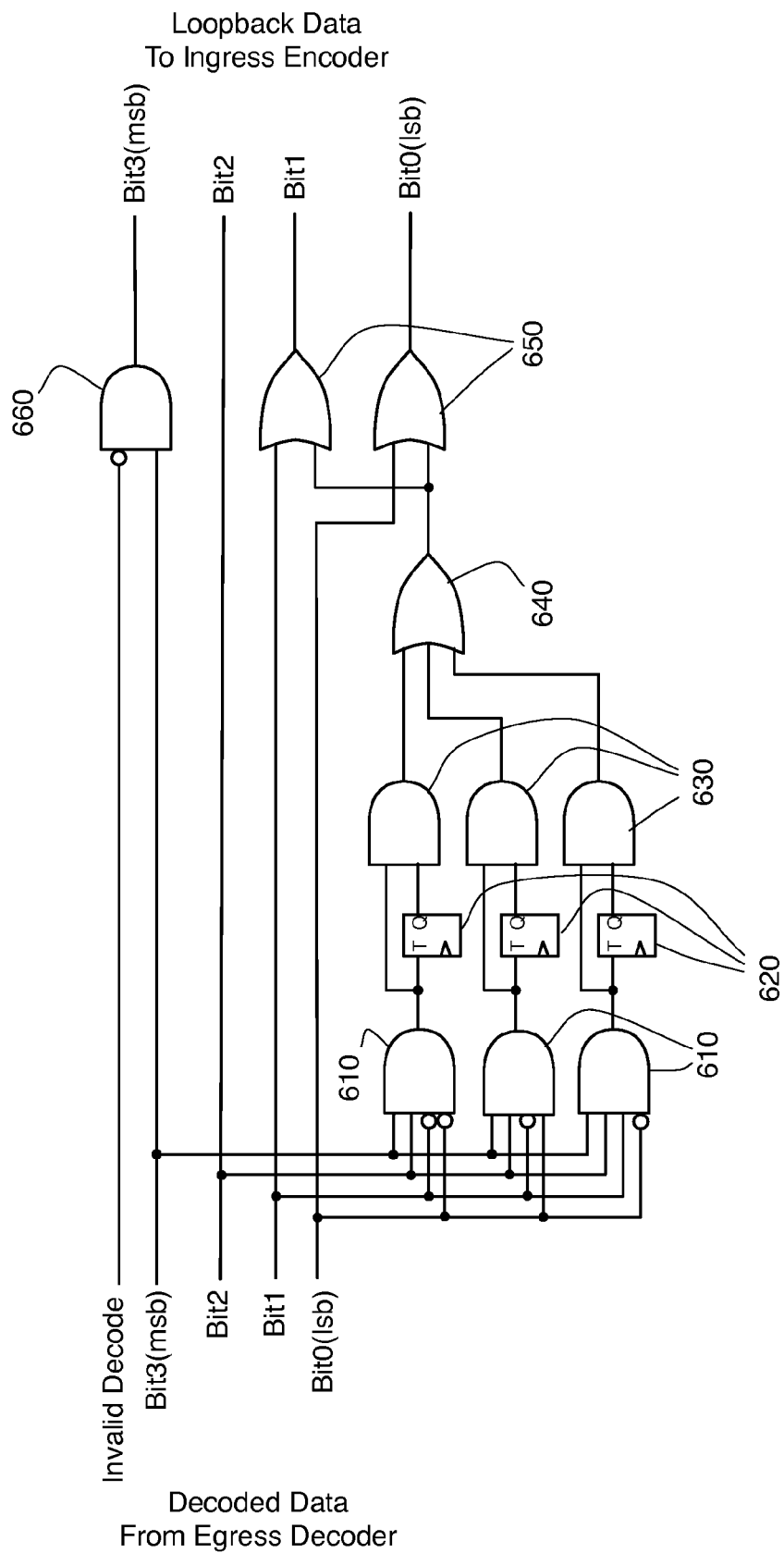
FIG. 6 illustrates an embodiment of Data Loopback 420 in FIG. 4 for an FTTL4 code.
Figure 7:
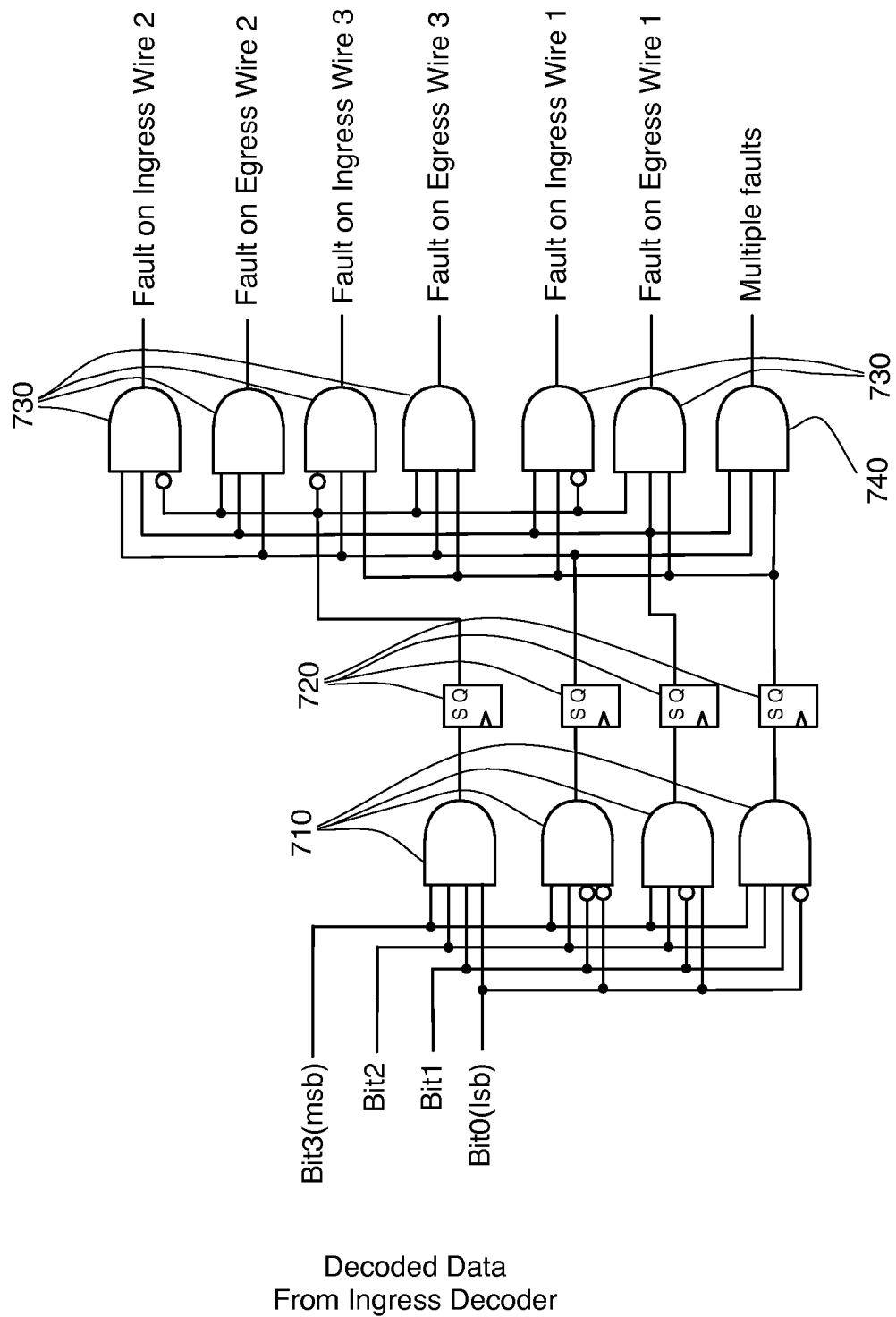
FIG. 7 illustrates an embodiment of Pattern Checker 430 in FIG. 4 for an FTTL4 code.

The preferred embodiments of the Pattern Generator 410, Data Loopback 420, and Pattern Checker 430 in FIG. 4 for an FTTL4 transition code are shown in FIGS. 5, 6, and 7 respectively. Those skilled in the art will understand that other logic representations and implementation variations are possible to implement the specified behavior described for the disclosed systems and methods.

An embodiment of the Pattern Generator 410 in FIG. 4 for an FTTL4 transition code is shown in FIG. 5. The circuit shown includes a Pseudo-Random Bit Sequence (PRBS) Generator 510 with a four bit output, and combinatorial encoder logic 520. The PRBS Generator produces pseudo-random data in the range {b0000 ... b1111}. The encoder logic detects codes in the range {b1100 ... b1111} which are not members of the DATA(GENERATE(2)) set, and substitutes a member of this set by forcing either bit 3 or bit 2 to "0". The bit to be forced is randomly determined by another bit of the PRBS generator output. Implementations are also possible using fewer logic gates, which remove the randomization and always force either bit 3 or bit 2.

An embodiment of the Data Loopback 420 in FIG. 4 for an FTTL4 transition code is shown in FIG. 6. The decoded data from the decoder on the egress path of FIG. 4 is presumed to have a 4-bit data output and an "Invalid decode" signal, which indicates the codeword received was not valid. The Data Loopback detects valid reduced-transition codewords that are members of the OVERLAP sets using AND gates 610. When one of these gates detects a valid reduced-transition codeword in an OVERLAP set, it asserts the T input of toggle flip-flops 620 such that the flip-flop inverts its state value on the next clock edge. If the current state of the flip-flop is "0", then the Data Loopback does not alter the data in the loopback path. If the current state of the flip-flop is "1", then AND gates 630, OR gate 640, and OR gates 650 force bits 1:0 to "11" such that the data on the loopback path is b1111. (Bits 3:2 must already be "11" for the data to be part of an OVERLAP set.) The insertion of b1111 (an egress-fault indication codeword of the DATA(GROUP(TC>2|TC<1)) set) indicates that the fault exists before the Data Loopback circuit.

FIG. 6 also illustrates using the "Invalid decode" condition to force the loopback data to be a valid codeword. This is done by forcing bit 3 to "0" such that the resulting data must be in the range {b0000 ... b0111}, all values of which are members of the DATA(GENERATE(2)) set.

An embodiment of the Pattern Checker 430 in FIG. 4 for an FTTL4 transition code is shown in FIG. 7. The decoded data is applied to the inputs of AND gates 710 which detect valid reduced-transition codewords that are members of the OVERLAP sets and egress-fault indication codewords that are part of the DATA(GROUP(TC>2|TC<1)) set. When a codeword is detected, the AND gate output is applied to the corresponding Set input of flip-flops 720. These flip-flops are reset before the start of the test sequence; when Set is asserted they transition to a set state and hold this state for the remainder of the test. The output of flip-flops 720 is decoded by gates 730 to determine the wire index associated with the location of the fault according to the truth table presented earlier in this section. The condition where multiple faults exist is decoded by gate 740.

Figure 8:
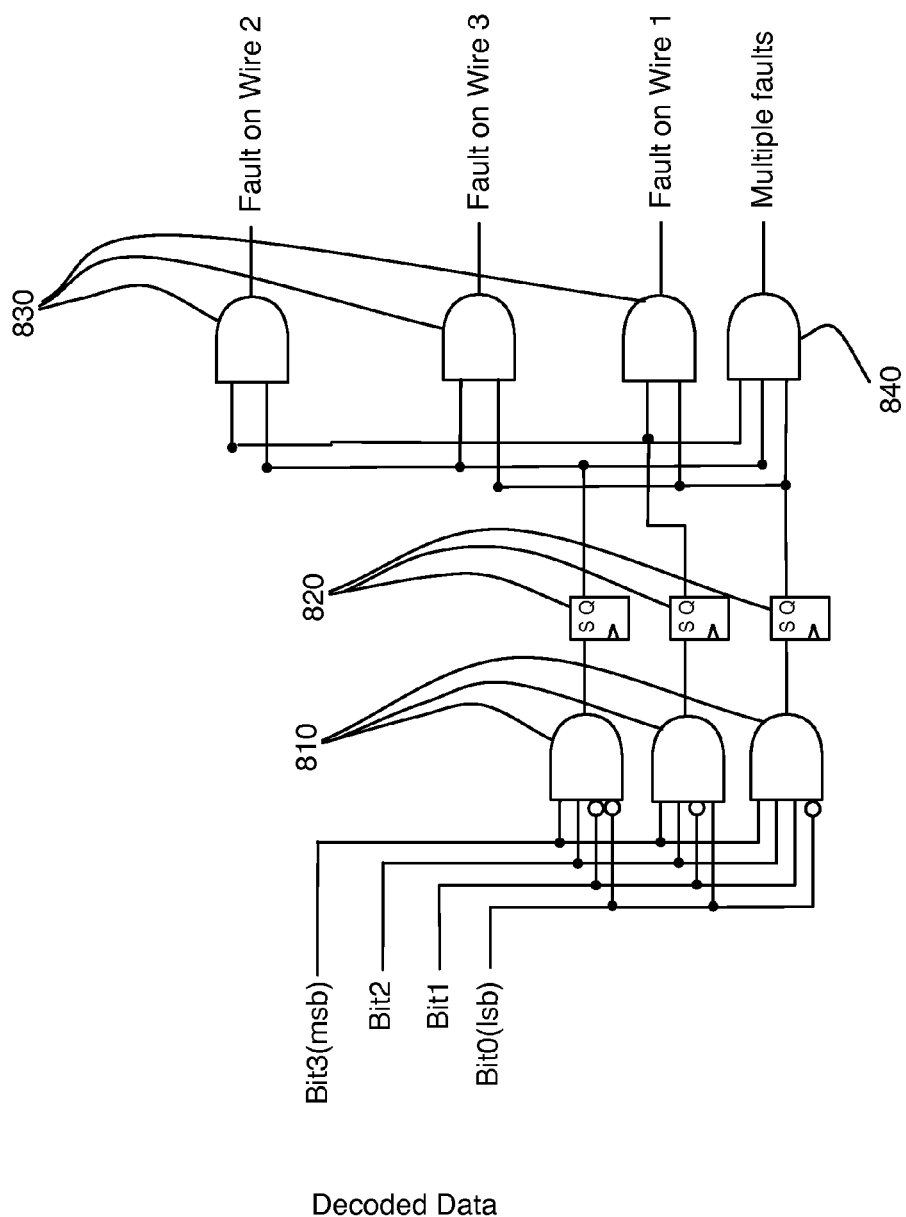
FIG. 8 illustrates another embodiment of a Pattern Checker for an FTTL4 code.

It should be noted that certain embodiments may not be configured to detect the location of the fault in only the pattern checker. In some embodiments, pattern checking could occur on both the transmit side and receive side, in which case an egress-fault indication codeword is not necessary. A more general case of identifying the location of the fault is given in FIG. 8. Similarly to FIG. 7, decoded data is applied to AND gates 810, which detect codewords that are members of the OVERLAP sets. When a codeword is detected, the AND gate output is applied to the corresponding Set input of flip-flops 820. These flip-flops are reset before the start of the test sequence; when Set is asserted they transition to a set state and hold this state for the remainder of the test. The output of flip-flops 820 is decoded by gates 830 to determine the wire index of the wire fault. The condition where multiple faults exist is decoded by gate 840. Note that the example circuit given in FIG. 8 differs in that it is determining the wire index only, rather than determining an egress or ingress path associated with the fault. This simplified circuit allows embodiments to check faults on the egress and ingress paths independently, allowing detection of more potential wire faults.

Data Steering Circuit

Figure 9:
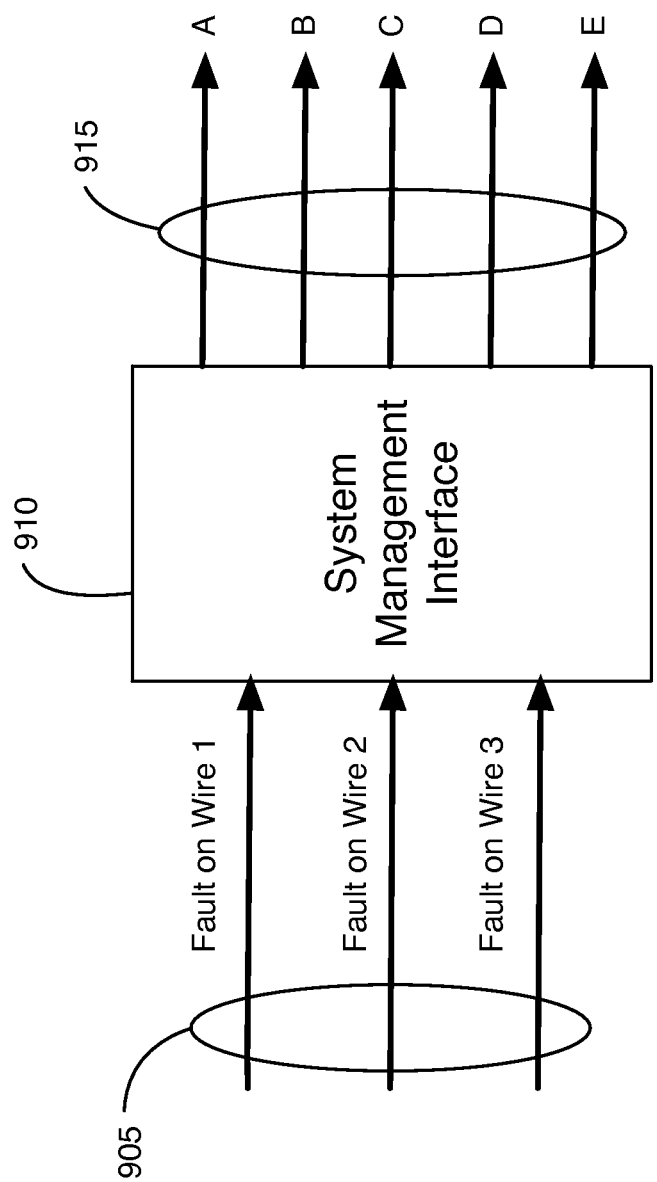
FIG. 9 illustrates an example System Management Interface circuit for an FTTL4 code.

In at least one embodiment, outputs of AND gates 730 or AND gates 830 are input into a System Management Interface 910, as shown in FIG. 9. FIG. 9 shows the inputs 905 representing signals corresponding to wire faults identified on wires 1, 2, or 3. It should be known that any subset of inputs comprising outputs of AND gates 730 or AND gates 830 can be used. System Management Interface 910 is configured to generate control signals 915 A, B, C, D, and E based on inputs 905. In at least one embodiment, a data steering circuit configured to bypass a wire affected by a fault uses these control signals.

Figure 10:
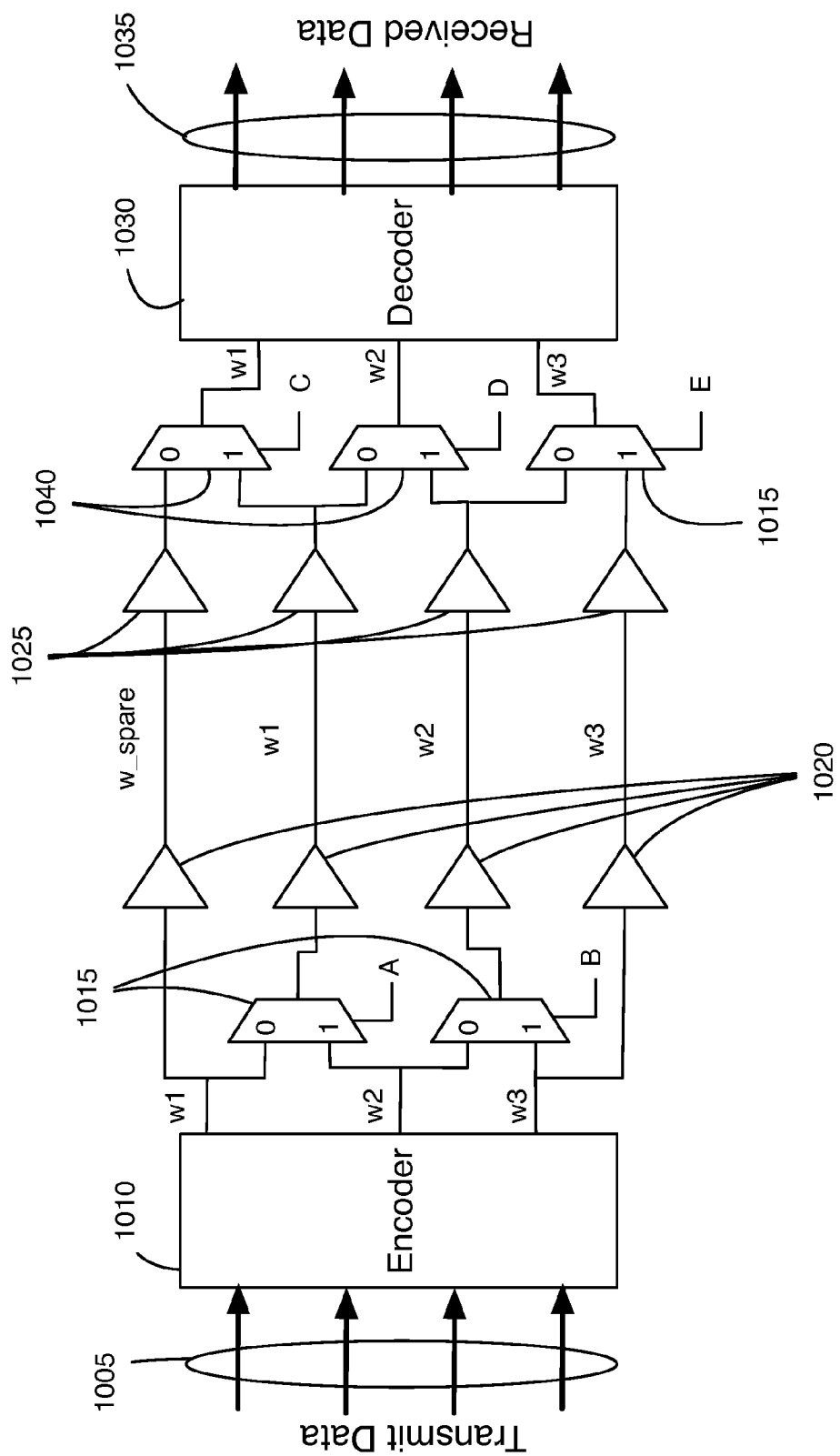
FIG. 10 illustrates an example embodiment of a Data Steering Circuit for an FTTL4 code.

An example embodiment of a data steering circuit is shown in FIG. 10. Encoder 1010 receives Transmit Data 1005, and encodes the data into information to be sent on wires w1, w2, and w3. In at least one embodiment, a data steering circuit comprises transmit multiplexers 1015 and receive multiplexers 1040, each multiplexer accepting a control signal 915 from the System Management Interface 910. The multiplexers 1015 are configured to bypass an affected wire based on control signals A and B. A portion of Drivers 1020 and receivers 1025 are activated based on control signals 915 to transmit data on the selected wires. Decoder 1030 receives outputs of multiplexers 1040, based on control signals C, D, and E. Table III below shows an example of possible control signals 915 generated according to inputs 905, and which wires are utilized in each case:

TABLE III

| Fault on Wire 1 | Fault on Wire 2 | Fault on Wire 3 | A | B | C | D | E | Wire being used: |
|---|---|---|---|---|---|---|---|---|
| 0 | 0 | 0 | 0 | 0 | 0 | 0 | 0 | {w1, w2, w3} |
| 1 | 0 | 0 | 0 | 0 | 1 | 0 | 0 | {w_spare, w2, w3} |
| 0 | 1 | 0 | 1 | 0 | 1 | 1 | 0 | {w_spare, w1, w3} |
| 0 | 0 | 1 | 1 | 1 | 1 | 1 | 1 | {w_spare, w1, w2} |

The examples illustrate the use of transitions codes in the fault detection of integrated circuit interconnections. At least one embodiment uses the FTTL4 transition code described in Shokrollahi I. At least one embodiment addresses Through-Silicon-Via interconnection faults between stacked integrated circuit devices. No limitation is implied, however, as other embodiments may in general use any transition code and/or interconnection means satisfying the basic requirements described herein. The methods disclosed in this application may be equally applicable to other encoding methods, and to communication media including optical and wireless communications. Thus, descriptive terms such as "voltage" or "signal level" should be considered to include both electrical equivalents such as "current", and also equivalents in other measurement systems, such as "optical intensity", "RF modulation", etc. Specific examples provided herein are for purposes of description, and do not imply a limitation.

As used herein, "physical signal" includes any suitable behavior and/or attribute of a physical phenomenon capable of conveying information. In accordance with at least one embodiment, physical signals may be tangible and non-transitory.

Embodiments

In at least one embodiment, a system comprises: a decoder configured to decode a sequence of received transition codewords of a transition code into a plurality of sets of m data bits, each codeword corresponding to one set of m data bits, the received transition codewords corresponding to test codewords having been transmitted via an egress path, each test codeword comprising n elements and having c transitions, and wherein any set of c−1 transitions of the c transitions corresponds to a valid reduced-transition codeword, wherein n and c, and m are an integers greater than or equal to 2; a data loopback circuit configured to receive the plurality of sets of m data bits and to determine, for each set, if the m data bits correspond to a reduced-transition codeword, and responsively generate a plurality of sets of m response bits based on the determinations. In at least one embodiment, the data loopback circuit generates at least one set of m response bits corresponding to an egress-fault indication codeword in response to receiving data bits corresponding to a reduced-transition codeword. In at least one embodiment, the egress-fault indication codeword is an error-signaling transition codeword having TC number of transitions, wherein TC is an integer according to: c<TC or TC<c−1. In at least one embodiment, the data loopback circuit generates a subset of the plurality of sets of m response bits by retransmitting a subset of the received plurality of sets of m data bits. In at least one embodiment, the data loopback circuit is configured to generate a listing of received reduced-transition codewords, and to responsively determine a wire index of a wire fault.

In at least one embodiment, a system comprises: a pattern generator configured to generate a bit pattern comprising a plurality of sets of m data bits representing a sequence of valid transition codewords of a transition code, each valid transition codeword comprising n elements and having c transitions, wherein any set of c−1 transitions of the c transitions corresponds to a valid reduced-transition codeword, and wherein m, n, and c, are integers greater than or equal to 2; an encoder configured to generate the sequence of valid transition codewords based on the bit pattern and transmit the sequence on an egress path; a decoder configured to receive a sequence of response codewords on an ingress path and decode them into a plurality of sets of m bits; and, a pattern checker configured to receive the m bits and generate a listing of received reduced-transition codewords, and to responsively determine (i) a wire index of a wire fault and (ii) a path associated with the wire fault based on the listing. In at least one embodiment, the listing corresponds to a combination of states of state elements. In at least one embodiment, the state elements are flip-flops. In at least one embodiment, the pattern checker comprises a logic circuit configured receive the combination of states and responsively generate signals identifying the wire index and path associated with the wire fault. In at least one embodiment, the system further comprises a data steering circuit configured to receive the signals representing the wire index and path identified by the wire fault and responsively bypass a communication wire identified by the wire index on the path.

Figure 11:
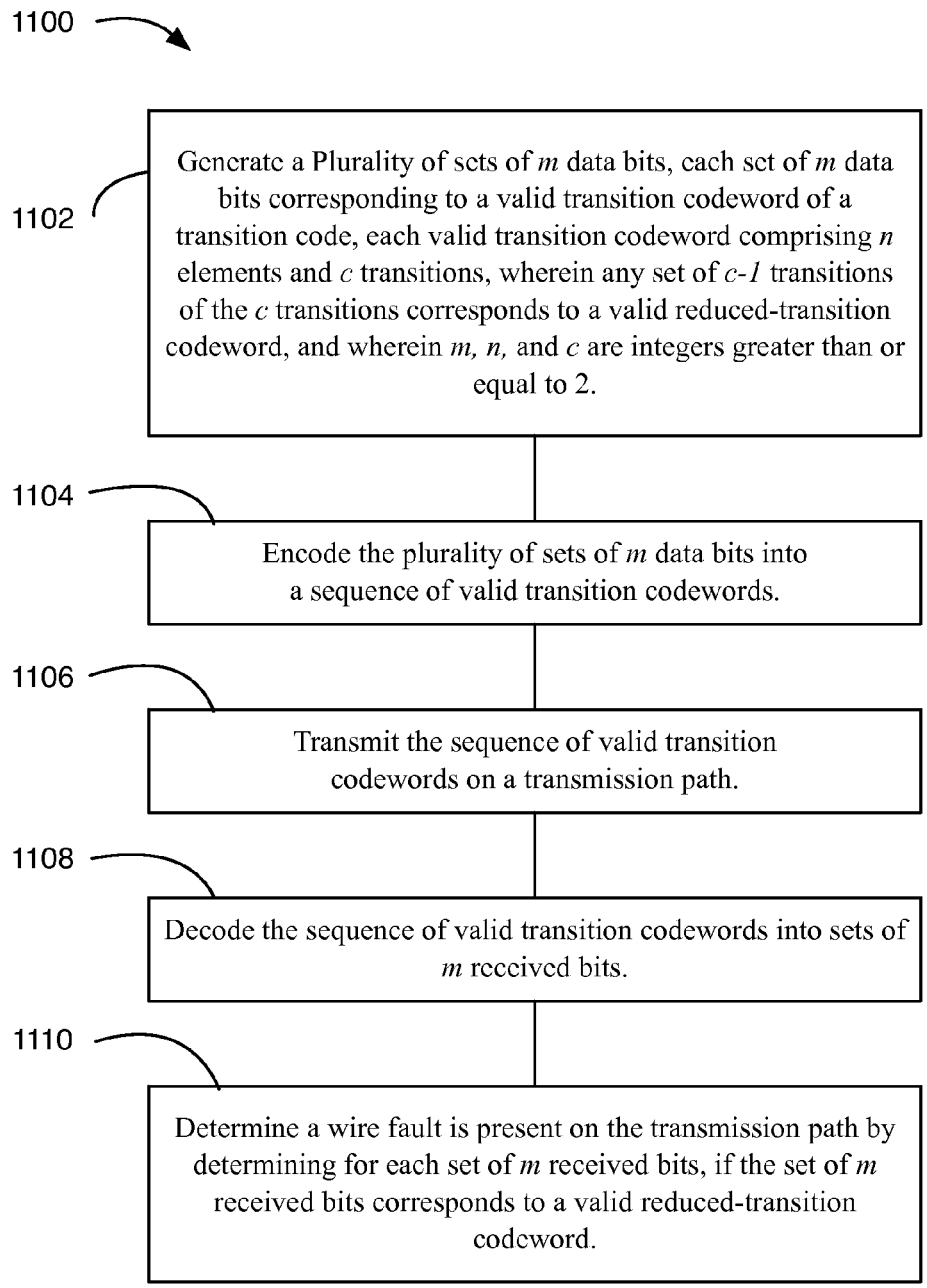
FIG. 11 illustrates a method in accordance with at least one embodiment.

In at least one embodiment, a method 1100 as shown in FIG. 11 comprises generating, at block 1102, a plurality of sets of m data bits, each set of m data bits corresponding to a valid transition codeword of a transition code, each valid transition codeword comprising n elements and c transitions, wherein any set of c−1 transitions of the c transitions corresponds to a valid reduced-transition codeword, and wherein m, n, and c are integers greater than or equal to 2, encoding, at block 1104 the plurality of sets of m data bits into a sequence of valid transition codewords, transmitting, at block 1106, the sequence of valid transition codewords on a transmission path, decoding, at block 1108 the sequence of valid transition codewords into sets of m received bits, and, determining, at block 1110, a wire fault is present on the transmission path by determining, for each set of m received bits, if the set of m received bits corresponds to a valid reduced-transition codeword. In at least one embodiment, the method further comprises generating a plurality of sets of m response bits based on the determinations. In at least one embodiment, at least one of the sets m response bits represents a path-fault indication codeword. In at least one embodiment, the path-fault indication codeword represents a valid transition codeword having TC number of transitions, wherein TC is an integer according to: c<TC or TC<c−1. In at least one embodiment, the method further comprises identifying a set of m data bits representing a path-fault indication codeword. In at least one embodiment, the method further comprises generating a listing of valid reduced-transition codewords. In at least one embodiment, the method further comprises identifying a wire index of a wire fault based on the listing. In at least one embodiment, the listing is represented by a combination of states. In at least one embodiment, the transition code is an FTTL4 code. In at least one embodiment, the method further comprises identifying a set of m data bits representing an invalid codeword, and suppressing the invalid codeword by substituting a set of m response bits representing a valid transition codeword having c transitions.

We claim:

1. A system comprising:
    a decoder configured to decode a sequence of received transition codewords of a transition code into a plurality of sets of m data bits, each codeword having n elements and corresponding to one set of m data bits, the received transition codewords corresponding to valid transition codewords having been transmitted via n wires of an egress path having a spare wire in addition to the n wires, each valid transition codeword and having c transitions, and wherein any set of c−1 transitions of the c transitions corresponds to a valid reduced-transition codeword, wherein n and c, and m are integers greater than or equal to 2; and,
    a data loopback circuit configured to:
        receive the plurality of sets of m data bits;
        detect two or more sets of m data bits as corresponding to valid reduced-transition codewords indicative of an egress wire fault, the valid reduced-transition codewords collectively forming a group of valid reduced-transition codewords associated with one of the n wires of the egress path associated with the egress wire fault; and
        generate a plurality of sets of m response bits comprising (i) the detected two or more sets of m data bits and (ii) at least one set of m response bits corresponding to an egress fault indication codeword; and
    an encoder configured to encode the plurality of sets of m response bits into a plurality of response codewords having n elements and to responsively transmit the response codewords via n wires of an ingress path.

2. The system of claim 1, wherein the egress-fault indication codeword is a transition codeword having TC number of transitions, wherein TC is an integer according to: c<TC or TC<c−1.

3. A system comprising:
    a pattern generator configured to generate a plurality of sets of m data bits representing a sequence of valid transition codewords of a transition code, each valid transition codeword comprising n elements and having c transitions, wherein any set of c−1 transitions of the c transitions corresponds to a valid reduced-transition codeword, and wherein m, n, and c, are integers greater than or equal to 2;
    an encoder configured to generate the sequence of valid transition codewords based on the plurality of sets of m data bits and to transmit the sequence of codewords on n wires of an egress path, the egress path further comprising a spare wire in addition to the n wires;
    a decoder configured to receive a sequence of response codewords via n wires of an ingress path further comprising a spare wire in addition to the n wires, the decoder configured to decode the sequence of response codewords into a plurality of sets of m response bits;
    a pattern checker configured to receive the plurality of sets of m response bits and to generate a listing of received reduced-transition codewords, and to responsively determine (i) a wire index of a wire fault based on the listing of received reduced-transition codewords and (ii) a path associated with the wire fault based on the presence of an egress fault indication codeword, the pattern checker configured to responsively generate a set of wire steering control signals; and
    wire steering circuits connected to the egress and ingress paths, wherein one of the steering circuits is configured to reroute codeword elements from the wire on the determined path having the wire index to the spare wire of the determined path.

4. The system of claim 3, wherein the listing corresponds to a combination of states of state elements.

5. The system of claim 4, wherein the state elements are flip-flops.

6. The system of claim 4, wherein the pattern checker comprises a logic circuit configured receive state information and to responsively generate signals identifying the wire index and path associated with the wire fault, the generated signals used to generate the set of wire steering control signals.

7. A method comprising:
    generating a plurality of sets of m data bits, each set of m data bits corresponding to a valid transition codeword of a transition code, each valid transition codeword comprising n elements and c transitions, wherein any set of c−1 transitions of the c transitions corresponds to a valid reduced-transition codeword, and wherein m, n, and c are integers greater than or equal to 2;
    encoding the plurality of sets of m data bits into a sequence of valid transition codewords;
    transmitting the sequence of valid transition codewords on n wires of an egress path, the egress path having a spare wire in addition to the n wires;
    decoding the sequence of valid transition codewords into a plurality of sets of m received bits;
    detecting two or more sets of m received bits as corresponding to valid reduced-transition codewords indicative of an egress wire fault, the valid reduced-transition codewords collectively forming a group of valid reduced-transition codewords associated with one of the n wires of the egress path associated with the egress wire fault; and
    generating a plurality of sets of m response bits comprising (i) the detected two or more sets of m data bits and (ii) at least one set of m response bits corresponding to an egress fault indication codeword; and
    encoding the plurality of sets of m response bits into a plurality of response codewords having n elements and responsively transmitting the response codewords via n wires of an ingress path.

8. The method of claim 7, wherein the path-fault indication codeword represents a valid transition codeword having TC number of transitions, wherein TC is an integer according to: c<TC or TC<c−1.

9. The method of claim 7, further comprising decoding the plurality of response codewords.

10. The method of claim 9, further comprising identifying a wire index of the egress wire fault based on the decoded plurality of response codewords.

11. The method of claim 9, wherein the wire index is identified by a combination of states, each state corresponding to a respective reduced-transition codeword of the group of reduced-transition codewords.

12. The method of claim 7, wherein the transition code is an FTTL4 code.

13. The method of claim 7, further comprising identifying a set of m data bits representing an invalid codeword, and suppressing the invalid codeword by substituting a set of m response bits representing a valid transition codeword having c transitions.

14. The system of claim 1, further comprising a steering logic circuit connected to the egress path configured to reroute codeword elements from the wire associated with the egress wire fault to the spare wire of the egress path.

15. The system of claim 14, wherein the steering logic circuit comprises a plurality of multiplexers, each multiplexor connected to two wires of the egress path and configured to receive a selection control signal.

16. The system of claim 14, wherein the steering logic circuit is configured to receive control signals from a system management interface.

17. The system of claim 9, wherein the logic circuit comprises a plurality of AND gates, each AND gate having respective combinations of inverting and non-inverting inputs to implement a respective combination of the received state elements.

18. The method of claim 11, wherein the combination of states is determined using a logic AND gate receiving state outputs from a plurality of flip-flops.

19. The method of claim 7, further comprising rerouting an element of the valid transition codewords from the wire associated with the egress wire fault to the spare wire of the egress path.

20. The method of claim 19, wherein the element of the valid transition codewords is rerouted using steering logic comprising multiplexers.

* * * * *